Figure 1:
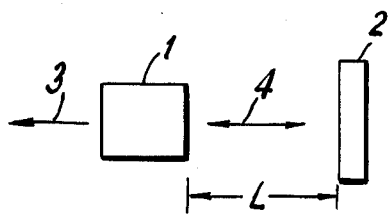

United States Patent [19]

Kobayashi et al.

[11] 4,079,339
[45] Mar. 14, 1978

[54] LIGHT SELF-INJECTING SEMICONDUCTOR LASER DEVICE

[75] Inventors: Kohroh Kobayashi; Roy Lang, both of Tokyo, Japan

[73] Assignee: Nippon Electric Company, Ltd., Tokyo, Japan

[21] Appl. No.: 685,915

[22] Filed: May 12, 1976

[30] Foreign Application Priority Data

May 17, 1975 Japan .......................... 50-59005
Sep. 8, 1975 Japan ...................... 50-123551[U]
Dec. 26, 1975 Japan ........................ 50-158872

[51] Int. Cl.$^2$ .............................................. H01S 3/19
[52] U.S. Cl. .......................... 331/94.5 C; 331/94.5 H; 331/94.5 M
[58] Field of Search ............. 331/94.5 H, 94.5 C, 331/94.5 S, 94.5 N, 94.5 M; 350/96 WG

[56] References Cited

U.S. PATENT DOCUMENTS

| | | | |
|---|---|---|---|
| 3,696,310 | 10/1972 | Paoli et al. ....................... | 331/94.5 H |
| 3,803,511 | 4/1974 | Thompson ........................ | 331/94.5 C |
| 3,875,532 | 4/1975 | Kobayashi et al. ............ | 331/94.5 H |

OTHER PUBLICATIONS

H. Statz et al., "Problem of Spike Elimination in Lasers", J. of App. Physics, vol. 36, No. 5, May 1965, pp. 1510-1514.

T. L. Paoli et al., "Single Longitudinal Mode Operation of CW Junction Lasers by Frequency-Selective Optical Feedback", App. Phy. Letters, vol. 25, No. 12, 15 Dec. 1974, pp. 744–746.

T. L. Paoli et al., "Frequency Stabilization and Narrowing of Optical Pulses from CW GaAs Injection Lasers," IEEE J. of Quantum Electronics, vol. QE-6, No. 6. June 1970, pp. 335–339.

J. I. Pankove et al., "High Precision Distance Measuring Laser", RCA Technical Notes, No. 918, Oct. 1972.

J. A. Rossi et al., "High-Power Narrow-Line Width Operation of GaAs Diode Lasers", Appl. Phys. Lett., vol. 23, No. 1, July 1973.

Primary Examiner—Stanley D. Miller, Jr.
Assistant Examiner—James W. Davie
Attorney, Agent, or Firm—Hopgood, Calimafde, Kalil, Blaustein & Lieberman

[57] ABSTRACT

A semiconductor laser device in which a part of the laser output is reflected from an external reflector and injected into the laser element with a delay that is less than the relaxation oscillation period of the laser pulse output.

10 Claims, 19 Drawing Figures

U.S. Patent    March 14, 1978    Sheet 1 of 4    4,079,339

$T_1 = 0.9\,ns$

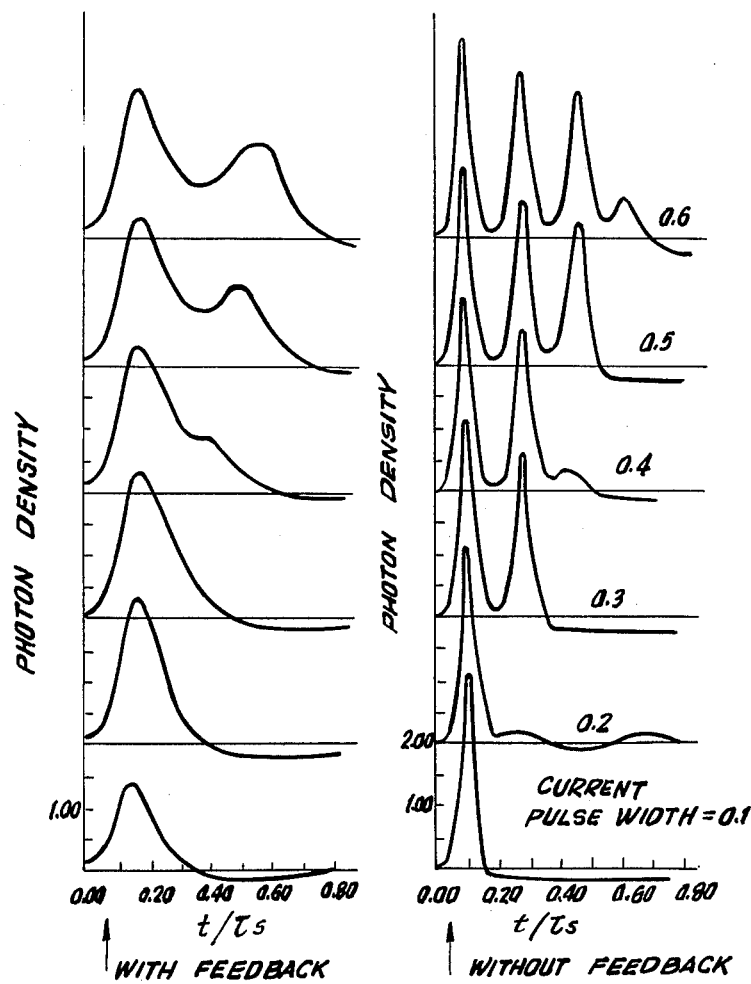
FIG. 3a WITH FEEDBACK
FIG. 3b WITHOUT FEEDBACK
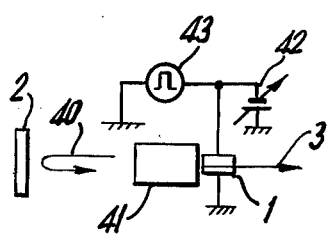
FIG. 4
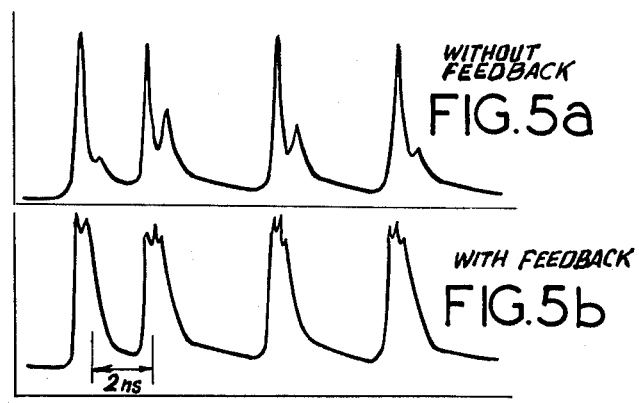
FIG. 5a WITHOUT FEEDBACK
FIG. 5b WITH FEEDBACK

LIGHT SELF-INJECTING SEMICONDUCTOR LASER DEVICE

The present invention relates generally to pulsemodulatable semiconductor laser devices, and more particularly to semiconductor laser devices capable of providing desirable optical pulse waveforms with a greater pulse height and making output modulation available at high speed.

Semiconductor lasers have become increasingly important light sources for optical communication systems and optical data processing systems because they are small in size, light in weight, operable with high efficiency, and make direct output modulation available. In a practical semiconductor laser, the upper limit for the rate of direct laser output modulation by a current pulse signal is 400 megabits per second. This is mainly because the optical output waveform is distorted due to spiking oscillation which include an overshoot emerging immediately after the rise of the light pulse. For substantial high-speed modulation, therefore, the spiking oscillation must be eliminated. One prior art approach to this problem, as described in co-pending application, Ser. No. 605,810, U.S. Pat. No. 3,999,146, assigned to the assignee of the present application, is to externally inject a light beam into the resonator of a semiconductor laser under direct modulation. This approach can suppress the output spiking oscillation to a minimum and reduce the delay of the rise of an oscillated laser pulse, thus making high speed modulation possible. In practice, however, two laser diodes have had to be used in one device because of the fact that semiconductor laser are considered to be a desirable external light source. However, the use of two laser diodes has necessitated more maintenance efforts than where a single laser diode is used. Furthermore, suppressing the spiking oscillation makes it impossible to effectively utilize the high peak value of an output light pulse generated under spiking oscillation.

It is therefore an object of the present invention to provide a semiconductor laser device that is, relatively simple in construction, uses one semiconductor laser element, and is modulatable at high speed.

It is another object of the invention to provide a semiconductor laser device modulatable at high speed and capable of generating a large signal output by utilizing the high initial peak emerging at relaxation oscillation.

According to the invention, part of the output beam of the semiconductor laser element, e.g., laser diode, is reflected from an external mirror and injected into the laser diode. The output beam is thus fed back to the laser diode with a delay $T_f$ depending on the distance between the laser diode and the mirror. Without the external mirror, the pulse output beam of the diode has a relaxation oscillation of period $T_i$. The feedback delay $T_f$ is determined to be smaller than the relaxation oscillation period $T_i$. This makes it possible to flatten the valleys between output light pulse peaks.

Figure 2:
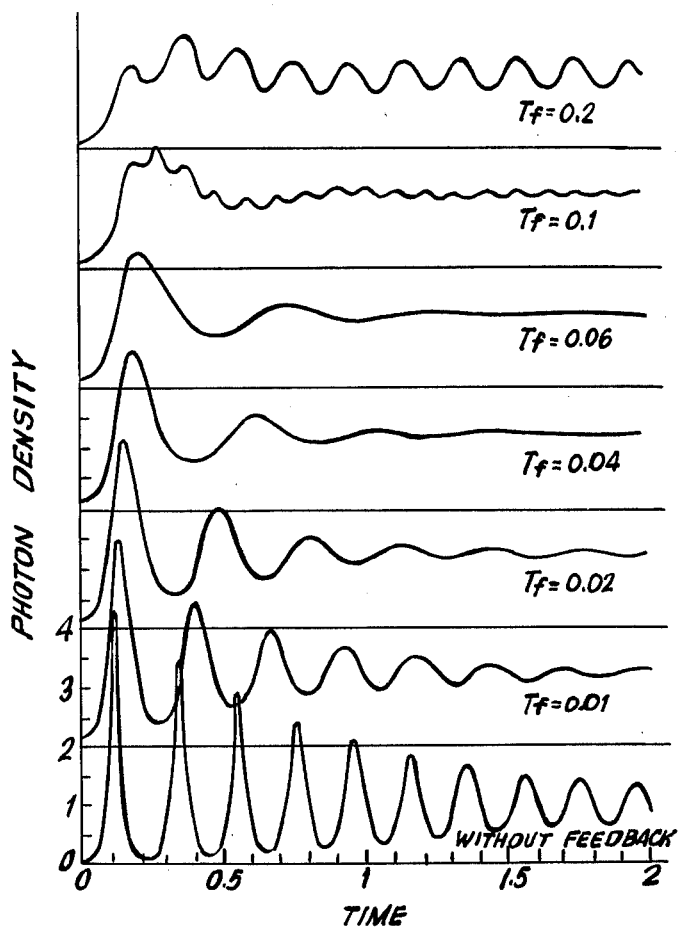

Other objects, features and advantages of the invention will become apparent from the following detailed description taken in conjunction with the accompanying drawings, wherein:

FIG. 1 is a schematic diagram showing one fundamental arrangement of a laser device according to the invention, FIG. 2 shows analytical output light waveforms emitted from a laser diode under an oscillation driven by a step pulse current.

Figure 6A:
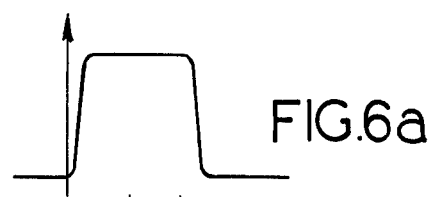
Figure 6B:
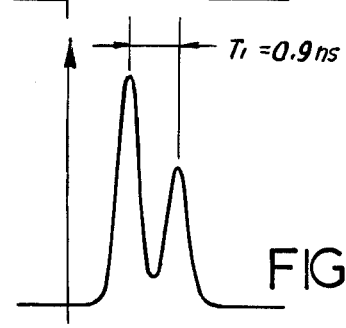
Figure 6C:
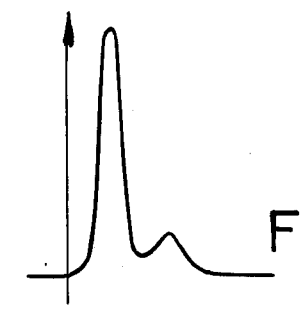
Figure 6D:
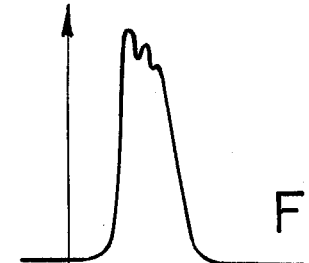
Figure 6E:
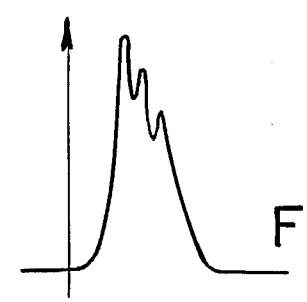
Figure 6F:
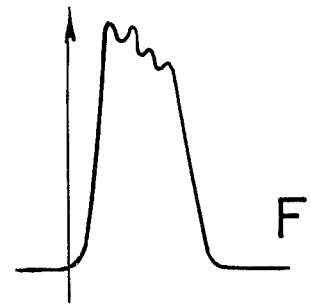
Figure 7:
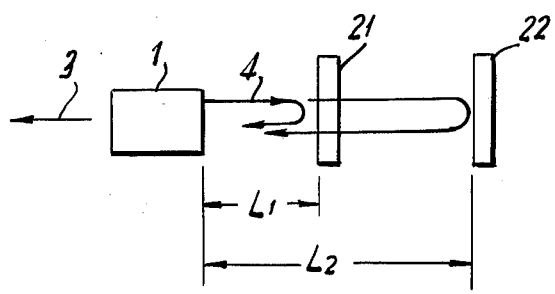
Figure 8:
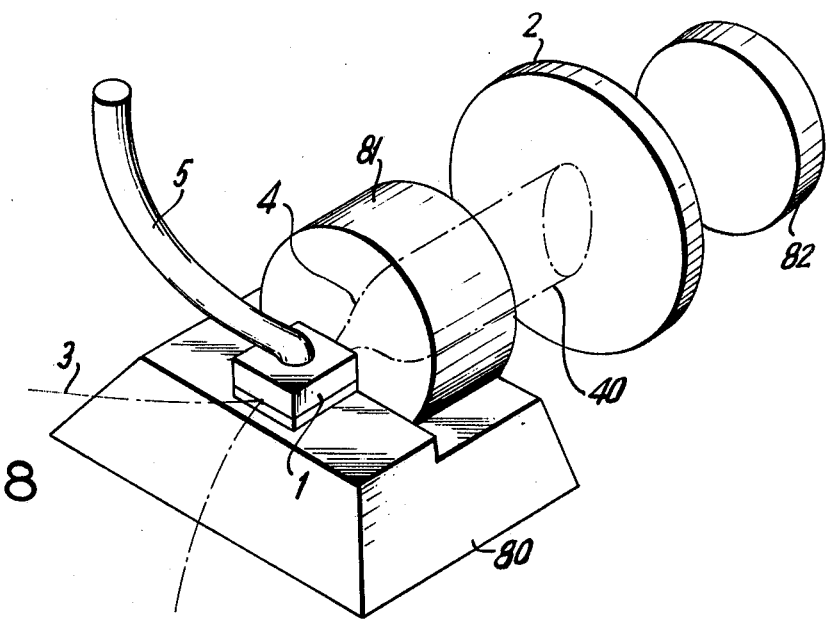
Figure 9:
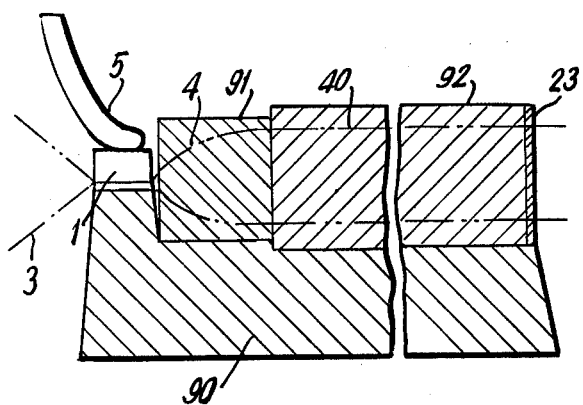
Figure 10:
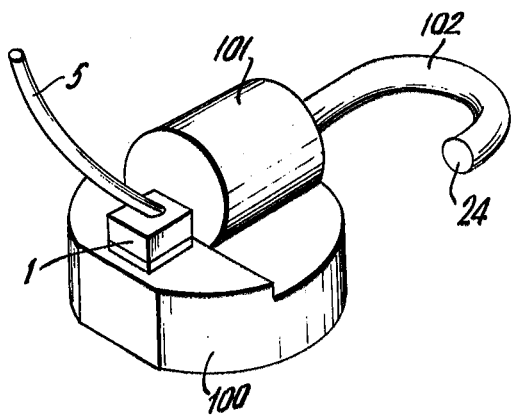
Figure 11:
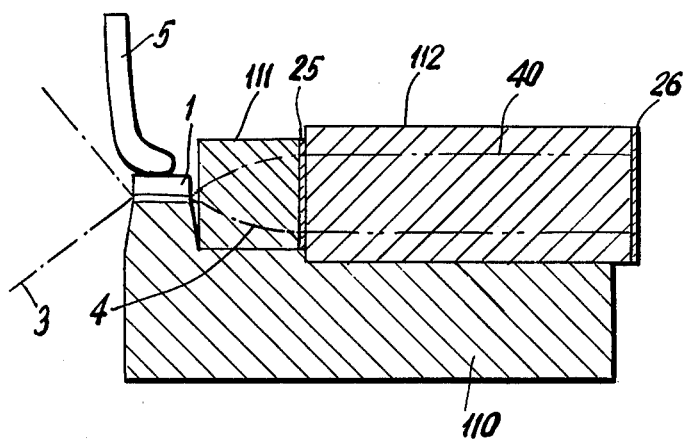
Figure 12:
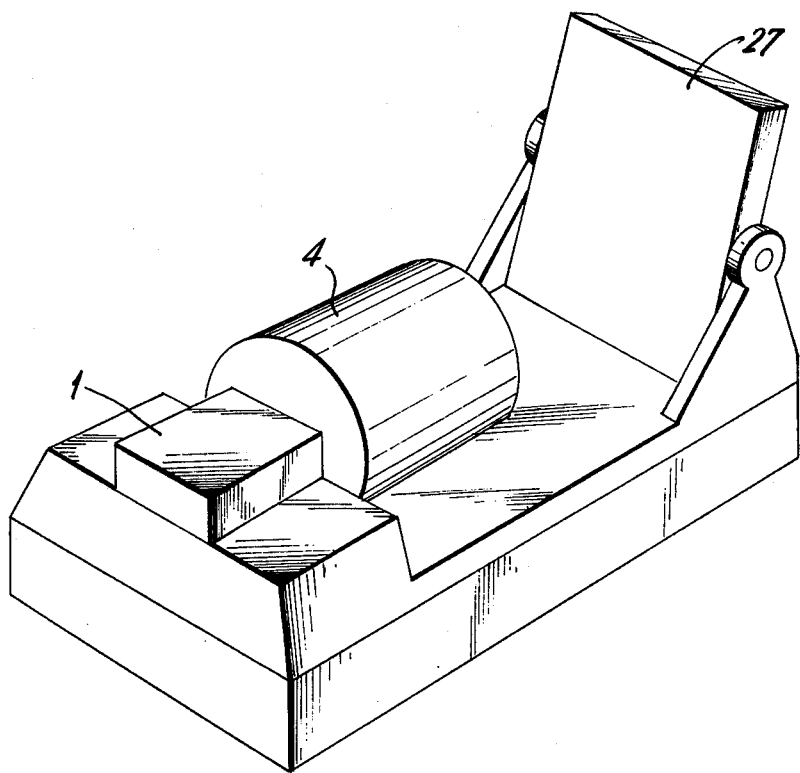

FIGS. 3A and B show analytical output light waveforms emitted from a laser diode under an oscillation driven by a shot of pulse current, with and without feedback, respectively, FIG. 4 is a schematic diagram of an experimental arrangement according to the invention, FIGS. 5A and 5B are experimental results showing pulsemodulated output light waveforms without and with a light feedback respectively, FIGS. 6A to 6F show output pulse waveforms varied with time delay $T_f$ under the application of a modulation current pulse of 2 ns width, FIG. 7 is a schematic diagram showing another fundamental arrangement of a laser device using two mirrors according to the invention, FIG. 8 is a perspective view of a laser device according to a first embodiment of the invention, FIG. 9 is an axial cross-sectional view of a laser device according to a second embodiment of the invention, FIG. 10 is a perspective view of a laser device according to a third embodiment of the invention, FIG. 11 is an axial cross-sectional view of a laser device according to a fourth embodiment of the invention, and FIG. 12 is a perspective view of a laser device according to a fifth embodiment of the invention in which the output pulse waveform and spectrum width are improved.

Referring to FIG. 1, there is shown a reflecting mirror 2 installed on the output side of a semiconductor laser diode 1 and spaced from the laser diode by an optical distance L. (The optical distance can be defined as the product of the actually measured distance and the refractive index of the medium between the diode 1 and the mirror 2.) The diode 1 generates output beams 3 and 4 in both directions, of which the beam 4 is reflected from the mirror 2 and is injected into the diode 1, with a time delay $T_f$.

$$T_f = \frac{2L}{C_o} \quad (1)$$

where $C_o$ is a velocity of light in the air.

The effect of such light injection is analytically described below. Rate equations are simple, basic equations useful for describing the operating characteristics of a semiconductor junction laser. In the active region of the laser diode, variations in the number of electrons and in the light intensity (i.e., the number of photons) with the lapse of time t can be expressed by the following rate equations:

$$n = P - \frac{n}{\tau s} - G(n)N \quad (2)$$
$$N = [G(n) - \Gamma] N(t) + \xi \Gamma N(t - T_f) \quad (3)$$

where
- n: injected carrier density (electron density)
- N: photon density
- P: excitation density
- $\tau_s$: lifetime of spontaneous emission
- $\Gamma$: term expressing optical loss, or the rate at which photons disappear from the resonator due to absorption and emission from the resonator end surface.

G(n): term expressing gain, or the rate at which photons are produced by the injected carriers. The second term of Eq. (3) expresses the effect of light feedback, where $\epsilon$ is a rate at which part of the photons lost from the resonator is injected (or fed back) to the resonator. The intensity of the injected light varies with time, as opposed to the arrangement where a light beam is injected externally.

Equations (2) and (3) are nonlinear simultaneous differential equations regarding electron density and photon density and hence it is difficult to derive a solution analytically from the equations alone; then the desired analytical data is ordinarily obtained by the use of a computer.

FIG. 2 is a graphic representation of step responses calculated according to the simultaneous equations (2) and (3), showing variations in the photon density as plotted with time under the application of a DC bias slightly higher than the threshold and with a stepped current applied. The time is normalized by the lifetime $\tau_s$ of spontaneous emission. Thus, when $T_f = 0.2$ and $\tau_s = 1$ ns, the light feedback time delay is 200 ps. (Note: The self-injection factor $\epsilon$ is selected to be 0.1.) FIG. 2 signifies the following facts:

(i) The light self-injection serves to urge the attenuation of the relaxation oscillation. One reason for this is that the laser becomes operated in the loss region due to the self-injected light. This occurs also when a light beam is injected externally. Another reason is that the reflected light is incident upon the resonator at a frequency that is different from that of the relaxation oscillation, resulting in an effect of canceling the oscillation of the initial light beam.

(ii) The frequency of the relaxation oscillation decreases over the range of $T_f = 0.01$ to 0.06.

(iii) With $T_f$ increased (e.g., $T_f = 0.1, 0.2$), an oscillation at a cycle as large as $T_f$ occurs.

As described above, the light feedback serves to increase the number of cycles of relaxation oscillation and to broaden the width of each peak. Under excitation by a pulse whose width is as narrow as that of the initial peak the light feedback will lead to considerable improvement in the waveform of the output pulse. FIGS. 3A and 3B illustrate the advantages of the light feedback under excitation by a shot of pulse. In FIGS. 3A and 3B, the driving current pulse width is varied from 0.1 to 0.6 in terms of normalized time, and the light feedback time $T_f$ is selected to be 0.04 which is approximately 20% of the period of relaxation oscillation. When the width of the driving current pulse is small, there emerges only one peak even without light self-injection. This is because the excitation ends before the second peak. If, in such case, light self-injection is applied, the width of the light pulse increases as indicated by the curves in the lower part of FIGS. 3A and 3B. The number of peaks emerging at a relaxation oscillation increases with the increase in the width of the current pulse applied. The number of such peaks can be reduced by the light self-injection. When the driving current pulse is of a width causing two peaks, the light self-injection is most effective to provide a light pulse with no relaxation oscillation. Since an ordinary high-speed pulse modulation by RZ (return-to-zero) code rarely uses a driving current pulse whose width is wide enough to bring about 3 peaks, present invention has great advantage in the optical communication systems.

FIG. 4 shows an experimental arrangement for high-speed pulse modulation according to the invention, in which the laser diode 1 is a GaAs double heterojunction laser of planar stripe geometry. The diode 1 is connected to a variable DC bias source 42 and to a pulse source 43. One of the output beams of the diode 1 is converted into a nearly parallel beam 40 through a SELFOC® lens 41, which is reflected from a plane mirror 2 and fed back to the diode 1. The feedback time $T_f$ is adjusted by moving the mirror 2 in the direction of the output beams. The other output beam 3 of the diode 1 is incident upon a photodiode (not shown). In experiments, the output light waveforms were observed on a sampling oscilloscope, and the rise time of the measured system as a whole was less than 150 ps.

FIG. 5 shows experimental data on output pulse waveforms under the application of light self-injection (or light feedback). The waveforms shown are of pulse-code-modulated waveform at 500 megabits/sec rate using the RZ (return-to-zero) code. In this experiment, the feedback time delay $T_f$ was 250 ps. Without the light self-injection, the second peak varies high to low by a relaxation oscillation as shown in FIG. 5A. (This variation is due to a kind of pattern effect.) With the self-injection, on the other hand, the second peaks of the relaxation oscillation disappear as shown in FIG. 5B. It is apparent that the pulse width is broadened in the latter without sacrificing the pulse height in comparison with FIG. 5A. In the latter, therefore, the signal energy is increased. This is one of the important advantages available with the light self-injection method of the invention. In FIG. 5B, there are slight perturbations on the top of the pulse. This is probably due to the arrival of the reflected light behind the initial output light with a delay of $T_f$.

Generally, with the light self-injection applied, the second peak appears after the first one with a delay of $T_f$. Hence, if the time $T_f$ is too long, a wider valley will appear between the first and second peaks. While, if the time $T_f$ is too short, a light feedback will take place simultaneously with the initial relaxation oscillation. In such case, the light feedback serves little in increasing the reflection factor at the laser end and the output waveform is not appreciably improved. From analytical and experimental data, it has been found that the most desirable output waveform can be realized when the light feedback time $T_f$ is in the range: $T_f \simeq 0.2T_1$ to $0.3T_1$ (where $T_1$ is the period of relaxation oscillation without the light self-injection).

FIG. 6 shows variations of output light pulse waveforms with variations in the time delay $T_f$ under the application of a modulation current pulse of a constant width. When the modulation current pulse width is 2 ns as shown in FIG. 6A, the output light pulse obtained without the light self-injection has a large relaxation oscillation with a period $T_1$ (approximately 0.9 ns) as shown in FIG. 6B. When the time delay $T_f$ is reduced and a light self-injection is applied, the lasing delay time is reduced. For example, the waveform of FIG. 6C appears when $T_f$ is 100 ps. In this case, although the lasing delay is reduced and the peak width is increased, a large relaxation oscillation remains. The waveform of FIG. 6D is obtained when $T_f = 250$ ps (or approximately $0.28T_1$). This waveform is fairly good like the one shown in FIG. 5B. The waveform of FIG. 6E is obtained when $T_f = 300$ ps (or approximately $0.33T_1$). Although this one has shallow valleys between peaks unlike the one shown in FIG. 6B, the amplitudes of the oscillation are still large.

FIG. 6F shows a waveform obtained when two mirrors are located away of the end of a semiconductor laser 1 at optical distances $L_1$ and $L_2$, respectively, as shown in FIG. 7. The output beam 4 from the semiconductor laser 1 is reflected from first and second half-mirrors 21 and 22 and then injected into the laser 1 with the individual delays, e.g., $T_{f1}$ (100 ps) due to the first half-mirror 21, and $T_{f2}$ (300 ps) due to the second mirror 22. The resultant light pulse waveform is as shown in FIG. 6F, having a reduced lasing delay and an increased pulse width in comparison with the one shown in FIG. 6D. Thus, the arrangement as in FIG. 7 makes it possible to realize an output light beam having greater signal energy than is available with the arrangement using a single mirror.

FIG. 8 is a perspective view of a first embodiment of the invention, in which a diode 1 is tin-soldered to a copper heat sink 80 which serves also as an electrode. A current applying lead 5 is installed on the top of the diode 1. A converting light-transmission body 81 is installed on the heat sink 80 adjacent to one output end of the diode 1. The light transmission body 81 has a refractive index distribution which decreases nearly proportional to the square of the distance from the center in a cross-section perpendicular to the optical axis. For characteristics of the light transmission body 81 (SELFOC®) and the method of fabricating it, refer to British Pat. No. 1,266,521. The output beam 4 from the diode 1 is converted into a nearly parallel beam 40 through the converging light-transmission body 81 and is then reflected from a plane mirror 2 whose reflection factor is 50%. When the converging light-transmission body 81 has a center refractive index of 1.6 and is 3 mm long, and the distance between the reflecting mirror 2 and the light transmission body 81 is 20 mm, then the optical distance from the diode 1 to the reflecting mirror 2 can be made to be approximately 25 mm. The feedback delay $T_f$ can be determined to be about 0.17 ns, which is shorter than the period of the spiking oscillation present without a light feedback. A photodetector 82 is installed behind the the reflecting mirror 2. With this photodetector, the intensity of the output light passing through the reflecting mirror 2 is detected as a monitor output. Thus, variations in the output light intensity with changes in the ambient temperature or aging in the diode 1 can readily be monitored by observing the monitor light intensity. The other output beam 3 of the diode can be coupled directly to an optical system such as an optical fiber. The output light waveform can be improved as long as the light feedback time $T_f$ is shorter than the period $T_1$ of the spiking oscillation. For the most desirable output light waveform, the light feedback time $T_f$ should be in the range: $T_1/5 \leq T_f \leq T_1/3$. Therefore, it is desirable that the optical distance from the diode to the reflecting mirror be determined so that the value of $T_f$ meets the above condition.

FIG. 9 is an axial cross-sectional view of a second embodiment of the invention, which comprises a converging light-transmission body 91 of 3 mm long, similar to the one shown in FIG. 8, and a cylindrical glass body 92 of 16 mm in length, at one end of which a multilayer film of $SiO_2$ and $TiO_2$ is formed by deposition techniques to serve as a reflecting film 23. The converging light-transmission body 91 and the cylindrical glass body 92 are installed on a heat sink 90 adjacent to one output side of a semiconductor laser element 1. When the converging light-transmission body 91 and the cylindrical glass body 92 have the same refractive index, e.g., about 1.6, the optical distance is about 30 mm and the light feedback time $T_f$ is about 0.2 ns.

FIG. 10 is a perspective view of a third embodiment of the invention, in which a converging optical fiber 102 is used instead of the cylindrical glass body 92 used in the second embodiment. The refractive index of the optical fiber 102 is larger in the center part than in the periphery in the cross section perpendicular to the optical axis. One output beam from a diode 1 is converged by a converging light-transmission body 101 and then coupled to the optical fiber 102. One end of the optical fiber 102 has a reflecting film 24 as in the second embodiment. The optical fiber 102 is so flexible that it can be rolled into a package together with the semiconductor laser unit.

FIG. 11 is an axial cross-sectional view of a fourth embodiment of the invention realized as one concrete form of the conceptual arrangement shown in FIG. 7. This laser device comprises a converging light-transmission body 111 and a cylindrical glass body 112. Being 3 mm long, the light-transmission body 111 has at one end a reflecting film 25 formed of $SiO_2$-$TiO_2$ multilayer film. The cylindrical glass body 112 is 25 mm long, having at one end a reflecting film 26 formed of $SiO_2$-$TiO_2$ multilayer film. The end of the converging light-transmission body 111 where the reflecting film 25 is formed is bonded to the end of the cylindrical glass body 112 opposite to the reflecting film 26 by the use of a glass bonding agent. The two optical elements 111 and 112 are installed on a heat sink 110 so that the end of the converging light-transmission body 111 opposite to the reflecting film 25 faces one output end of the diode 1. In this construction, the reflecting films 25 and 26 serve as a unit of two reflecting mirrors. The reflection factors of the two mirrors are selected to be 40% and 90% respectively. The converging light-transmission body 111 and the cylindrical glass body 112 have the same refractive index (approximately 1.6) and optical distances of approximately 5 mm and 45 mm respectively. Their light feedback times $T_{f1}$ and $T_{f2}$ are approximately 0.03 ns and 0.27 ns respectively.

The beam reflected from the mirror 25, which is nearer the diode 1 than the other, serves to reduce the threshold value of the laser oscillation and equivalently increase the laser excitation, thereby reducing laser oscillation delay and expanding the width of the first spike at a spiking oscillation. The beam reflected from the other mirror 26 serves to flattened the valleys between the spiked peaks. In this manner, the two reflecting mirrors 25 and 26 in combination contribute much to improving the output waveform as described by referring to FIG. 6.

In this embodiment, because the two reflecting mirrors 25 and 26 are constructed into a unit, the laser device can operate stably over a long period of time.

FIG. 12 is a perspective view of a fifth embodiment of the invention, which makes it possible to improve not only the output light waveform but also the spectral quality of the output light. One output beam from the diode 1 is converted into a nearly parallel beam through a converging light-transmission body 4 and then applied to a diffraction grating 27, which in turn selectively feeds back to the diode 1 only a specific wavelength component which depends on the angle formed between the plane of the grating and the incident light. The technique for feeding back a specific wavelength component to a laser diode and thus obtaining an output light beam of narrow spectrum width is described in "High-power narrow-linewidth operation of GaAs diode lasers" by J. A. Rossi et al. published in Applied Physics Letters, Vol. 23, No. 1, pp. 25–27, July 1, 1973.

In the fifth embodiment, the output light pulse waveform and output light spectrum width are improved by suitably determining the distance between the diffraction grating 27 and the diode 1.

Although several preferred embodiments of the invention have been described above, various modifications may be made on the disclosed embodiments. For example, the converging light-transmission body used for converging the output beam to the reflecting mirror 2 may be replaced with other light converging element such as lens. The mirror 2 may be any type of mirror such as spherical mirror instead of plane type as long as it can feed back the output beam to the diode 1. When a spherical mirror is used, the light converging element may not be used since the spherical mirror itself converges light. In the disclosed embodiments, the optical distance between the mirror 2 and the diode 1 is fixed. Instead, the mirror 2 may be installed on an adjustable table to change the optical distance L for optimum output waveforms. Further, the disclosed embodiments employ two reflecting mirrors (or reflecting films). The number of reflecting mirrors used is not limited to two and more reflecting mirrors may be used. The reflection factors of the reflecting mirrors and the distances between the reflecting mirrors and the diode 1 are not limited to the disclosed values but may be suitably determined according to the characteristics of the spiking oscillation of the diode 1 used. Further, one or more reflecting mirrors may be installed on both output sides of the diode 1 at different distances.

As described in the foregoing, the present invention provides the optical approaches to improve the light output waveform in the time domain. The advantages of the light self-injection method may be summarized as follows:

(a) The number of peaks at a relaxation oscillation can be reduced.

(b) A large signal output can be obtained by utilizing the high, first peak emerging at a relaxation oscillation.

(c) The pulse width of a single peak can be expanded and hence the signal energy can be increased.

(d) The pattern effect—unsteady presence of the second peak at a relaxation oscillation—can be minimized.

(e) Only one laser element suffices, which simplifies the construction of the device and reduces the maintenance efforts.

While the invention has been described in its preferred embodiments, it is to be understood that modifications may occur to those skilled in the art without departing from the spirit of the invention.

What is claimed is:

1. A pulse-modulatable semiconductor laser device comprising a modulatable semiconductor laser element capable of emitting a train of light pulses in two opposing directions in response to an applied pulse-modulated current signal, each of said light pulses having a spiking oscillation; and an external cavity optically coupled to said laser element, and having a round-trip time that is not less than one-fifth and not more than one-third of the period of said spiking oscillation.

2. A semiconductor laser device comprising a semiconductor laser element capable of emitting light pulses having a relaxation oscillation period of $T_1$, and means located external to said laser element in the path of said light pulses for redirecting at least a portion of said light pulses to said laser element with a feedback delay $T_f$, where $T_f$ is not less than one-fifth and not more than one-third of $T_1$.

3. The laser device of claim 2, in which said redirecting means includes reflecting means.

4. The laser device of claim 3, further comprising light-converging means interposed between said laser element and said reflecting means.

5. The laser device of claim 3, in which said reflecting means includes a first partially reflecting element and a second reflecting element spaced from and in line with said first reflecting element and spaced farther from said laser element than said first reflecting element.

6. The laser device of claim 5, further comprising light-converging means interposed between said laser element and said first reflecting element.

7. The laser device of claim 6, further comprising a light-transparent body interposed between said first and second reflecting elements, at least one of said first and second reflecting elements comprising a reflective film secured to one end of said light-transparent body.

8. The laser device of claim 4, further comprising a light transparent member interposed between said light-converging means and said reflecting means, said reflecting means being secured to one end of said transparent member.

9. The laser device of claim 8, in which said transparent member is an optical fiber secured at one end to said light-converging means and at its other end to said reflecting means.

10. The laser device of claim 4, in which said reflecting means comprises means for reflecting back only a preselected frequency component of said light pulses.

* * * * *